(12) United States Patent
Cook et al.

(10) Patent No.: US 6,780,464 B2
(45) Date of Patent: Aug. 24, 2004

(54) THERMAL GRADIENT ENHANCED CVD DEPOSITION AT LOW PRESSURE

(75) Inventors: Robert C. Cook, Livermore, CA (US); Daniel L. Brors, Livermore, CA (US)

(73) Assignee: Torrex Equipment, Livermore, CA (US)

( * ) Notice: Subject to any disclaimer, the term of this patent is extended or adjusted under 35 U.S.C. 154(b) by 112 days.

(21) Appl. No.: 09/954,705

(22) Filed: Sep. 10, 2001

(65) Prior Publication Data

US 2002/0028290 A1 Mar. 7, 2002

Related U.S. Application Data

(63) Continuation-in-part of application No. 09/396,588, filed on Sep. 15, 1999, now Pat. No. 6,287,635, and a continuation-in-part of application No. 09/228,835, filed on Jan. 12, 1999, now Pat. No. 6,167,837, and a continuation-in-part of application No. 09/228,840, filed on Jan. 12, 1999, now Pat. No. 6,321,680, which is a continuation-in-part of application No. 08/909,461, filed on Aug. 11, 1997, now Pat. No. 6,352,593.

(60) Provisional application No. 60/100,594, filed on Sep. 16, 1998, provisional application No. 60/071,572, filed on Jan. 15, 1998, and provisional application No. 60/071,571, filed on Jan. 15, 1998.

(51) Int. Cl.$^7$ .......................................... C23C 16/455

(52) U.S. Cl. .............................. 427/248.1; 427/255.5; 427/255.39; 427/585

(58) Field of Search .......................... 427/248.1, 255.5, 427/255.395, 585

(56) References Cited

U.S. PATENT DOCUMENTS

| | | | |
|---|---|---|---|
| 4,105,810 A | 8/1978 | Yamazaki et al. | 427/248 |
| 4,178,877 A | 12/1979 | Kudo | 118/728 |
| 4,258,658 A | 3/1981 | Politychki et al. | 118/719 |
| 4,292,153 A | 9/1981 | Kudo et al. | 204/164 |
| 4,381,965 A | 5/1983 | Maher, Jr. et al. | 156/345 |
| 4,565,157 A | 1/1986 | Brors et al. | 118/719 |
| 4,653,428 A | 3/1987 | Wilson et al. | 118/725 |
| 4,693,777 A | 9/1987 | Hazano et al. | 156/345 |
| 4,745,088 A | 5/1988 | Inoue et al. | 437/102 |
| 4,811,684 A | 3/1989 | Tashiro et al. | 118/50.1 |
| 4,870,245 A | 9/1989 | Price et al. | 219/121.36 |
| 4,951,601 A | 8/1990 | Maydan et al. | 118/719 |
| 4,969,416 A | 11/1990 | Schumaker et al. | 118/725 |
| 4,976,996 A | 12/1990 | Monowski et al. | 427/255.5 |
| 5,097,890 A | 3/1992 | Nakao | 165/206 |
| 5,203,956 A | 4/1993 | Hansen | 156/643 |

(List continued on next page.)

FOREIGN PATENT DOCUMENTS

| | | |
|---|---|---|
| JP | 61-197638 | 9/1986 |
| JP | 03-011546 | 1/1991 |
| JP | 08-138620 | 5/1996 |

Primary Examiner—Timothy Meeks
(74) Attorney, Agent, or Firm—David Jaffer; Pillsbury Winthrop LLP

(57) ABSTRACT

A method wherein a thermal gradient over a substrate enhances Chemical Vapor Deposition (CVD) at low pressures. An upper heat source is positioned above the substrate and a lower heat source is positioned below the substrate. The upper and lower heat sources are operated to raise the substrate temperature to 400–700° and cause a heat gradient of 100–200° C. between the upper and lower heat sources. This heat gradient causes an increase in the deposition rate for a given reactant gas flow rate and chamber pressure. The preferred parameters for implementation of the present invention for poly crystalline silicon deposition include the temperature of the upper heat source 100–200° C. above the lower heat source, a substrate temperature in the range of 400–700° C., a reactant gas pressure between 250 and 1000 mTorr, and a gas flow rate of 200–800 sccm. The substrate is rotated, with 5 RPM being a typical rate. A deposition rate of 2000 angstroms per minute deposition of poly crystalline silicon is achieved with a 200° C. temperature differential, substrate temperature of 650° C., pressure of 250 mTorr and silane flow of 500 sccm.

9 Claims, 9 Drawing Sheets

U.S. PATENT DOCUMENTS

| | | | |
|---|---|---|---|
| 5,269,847 A | * 12/1993 | Anderson et al. | 118/715 |
| 5,272,417 A | 12/1993 | Ohmi | 315/111.21 |
| 5,291,030 A | 3/1994 | Brors | 250/573 |
| 5,356,475 A | 10/1994 | Diiorio et al. | 118/723 E |
| 5,383,984 A | 1/1995 | Shimada et al. | 156/345 |
| 5,458,689 A | 10/1995 | Saito | 118/724 |
| 5,458,724 A | 10/1995 | Syverson et al. | 156/345 |
| 5,493,987 A | 2/1996 | McDiarmid et al. | 117/102 |
| 5,551,985 A | 9/1996 | Brors et al. | 118/725 |
| 5,556,521 A | 9/1996 | Ganbari | 118/723 I |
| 5,558,717 A | 9/1996 | Zhao et al. | 118/723 E |
| 5,584,963 A | 12/1996 | Takahashi | 156/646.1 |
| 5,604,151 A | * 2/1997 | Goela et al. | 427/162 |
| 5,613,821 A | 3/1997 | Muka et al. | 414/217 |
| 5,626,678 A | 5/1997 | Sahin et al. | 118/723 E |
| 5,663,087 A | 9/1997 | Yokozawa | 438/762 |
| 5,759,263 A | * 6/1998 | Nordell et al. | 117/98 |
| 5,795,452 A | 8/1998 | Kinoshita et al. | 204/298.37 |
| 5,844,195 A | 12/1998 | Fairbain et al. | 219/121.43 |

* cited by examiner

THERMAL GRADIENT ENHANCED CVD DEPOSITION AT LOW PRESSURE

This application is a continuation in part of U.S. application Ser. No. 09/396,588 filed Sep. 15, 1999 now U.S. Pat. No. 6,287,635 (which claims the benefit of U.S. Provisional Application Serial No. 60/100,594 filed Sep. 16, 1998), which is a continuation in part of (a) U.S. application Ser. No. 08/909,461 filed Aug. 11, 1997, now U.S. Pat. No. 6,352,593 (b) U.S. application Ser. No. 09/228,835 filed Jan. 12, 1999 now U.S. Pat. No. 6,167,837 (which claims the benefit of U.S. application Ser. No. 60/071,572 filed Jan. 15, 1998), and (c) U.S. application Ser. No. 09/228,840 filed Jan. 12, 1999 now U.S. Pat. No. 6,321,680 (which claims the benefit of U.S. Provisional Application Serial No. 60/071,571 filed Jan. 15, 1998). The disclosures of the foregoing applications are hereby incorporated by reference.

BACKGROUND OF THE INVENTION

1. Field of the Invention

The present invention relates to methods and apparatus for chemical vapor deposition onto a substrate, and more particularly to a method that deposits silicon at a high rate due to enhanced mass transport by thermal diffusion, i.e., the "Soret effect", by using a temperature gradient above the substrate surface.

2. Description of the Prior Art

The semiconductor industry has been depositing poly crystalline silicon for a number of years. The method of choice for most applications is a Low Pressure Chemical Vapor Deposition (LPCVD) process. The LPCVD process is a well studied art wherein poly crystalline silicon deposition is accomplished by placing a substrate in a vacuum chamber, heating the substrate and introducing silane or any similar precursor such as disilane, dichlorosilane, silicon tetrachloride and the like, with or without other gases. The reactant gases are usually pre-heated prior to passing over a wafer when a rapid deposition is required. The pre-heating pre-activates the reactants and increases the rate of subsequent deposition. A disadvantage of this process is that it causes gas reactions that deplete the supply of available reactants which partially defeats the effect of pre-activation in increasing the deposition rate. Deposition rates of approximately 10 to 100 angstroms per minute are typical for low-pressure processes (less than 1 Torr) in a hot wall low pressure reactor. Deposition rates of 20 to 300 angstroms per minute are achieved in a vertical flow reactor with deposition rates as high as 500 angstroms per minute. Silicon deposition rates over 10,000 angstroms per minute have been reported, however these high deposition rates do not produce poly crystalline silicon films that are useful in manufacturing semiconductor devices because the resulting poly crystalline silicon has undesirable features such as large grain size, non uniform thickness, etc. Deposition rates of approximately 3000 angstroms per minute of useful semiconductor quality poly crystalline silicon are achieved with a higher pressure process (25 to 350 Torr) as described in detail in U.S. Pat. No. 5,607,724.

A typical prior art CVD system is illustrated in FIG. 1, and includes a reaction chamber 12 having a quartz tube 14. The chamber is enclosed on a first end by a seal plate 16 that can be removed for installation and removal of a boat 18 carrying substrates 20. A reactant gas 22 such as silane or similar precursor and hydrogen and a dopant gas such as phosphine are supplied to the chamber 12 through ports 24 and 25 to tubing 27 and flow through the chamber 12 and exit the exhaust port 26. A plurality of heater elements 28 are separately controlled and adjustable to compensate for the well known depletion of feed gas concentration as the gas 22 flows from the gas injection tube 27 to the exhaust port 26. The system of FIG. 1 typically operates at a gas chamber pressure in the range from 100 to 200 mTorr, and at a gas flow rate from 100–200 sccm. The reactant gas is usually silane diluted with hydrogen. Operating in the low pressure range of 100–200 mTorr with silane, or other similar precursor, results in a low deposition rate, typically in the range of 10 to 100 angstroms per minute, and 5 to 30 angstroms per minute if a dopant gas is introduced. The resulting surface roughness is typically 10–15 nm. Operation at higher concentrations of the reactant gases results in non-uniform deposition across the substrates, as well as large differences in the deposition rate from substrate to substrate. Increasing the gas flow rate in the chamber of FIG. 1 can improve deposition uniformity at higher pressures, but has the disadvantage of increasing the gas pressure resulting in gas phase nucleation causing particles to be deposited on the substrate.

There are other problems associated with the reactor of FIG. 1, such as film deposition on the interior surfaces of the quartz tube 14 causing a decrease in the partial pressure of the reactive feed gas concentration near the substrate surface. This results in a reduced deposition rate and potential contamination due to film deposited on the wall of tube 14 flaking off and falling on the substrate 20 surfaces. Another problem occurs due to the introduction of a temperature gradient applied between the injector end and exhaust end of the tube to compensate for the depletion of reactive chemical species from the entrance to the exit. As a result of this temperature gradient, the deposited poly crystalline silicon grain size varies from substrate to substrate, i.e. across the load zone, because the grain size is temperature dependent. This variation in grain size from substrate to substrate can result in variations of poly crystalline silicon resistivity and difficulties with the subsequent patterning of the poly crystalline silicon resulting in variations in the electrical performance of the integrated circuits produced.

A prior art vertical flow reactor 30 is illustrated in FIG. 2. This reactor is capable of deposition rates as high as 500 angstroms per minute. The substrates 32 are placed in a substrate carrier 34 in the reactor 30. The reactor chamber 36 is confined by a quartz bell jar 38 and a seal plate 40. The bell jar 38 is surrounded by a heater 42 for heating the substrates 32 to the required temperature. The reactant gases such as silane and hydrogen are introduced through ports 44 and 46, and flow through the gas injection tube 48 to the injector 50, across the substrate 32 and out the exhaust port 52. The arrangement of FIG. 2 greatly reduces the gas depletion effect experienced with the device of FIG. 1, and thereby allows an increased gas flow which results in an increased deposition rate of up to 500 angstroms per minute. Two major problems are associated with the apparatus of FIG. 2. In operation, the injection tube 48 and injector 50 are at the same temperature as the substrates 32, a condition that results in silicon deposition in and on the injection tube 48 and injector 50, which then flakes off and is deposited as particles on the substrate 32. The other major problem is that the substrates 32 are not at the same temperature due to the method of heating the substrates from heater 42 with no heater below the substrates. The non-uniform heating causes a non-uniform silicon deposition over the substrates 32 as poly crystalline silicon deposition is a surface reaction rate limited process, which is very temperature dependent.

FIG. 3 shows a prior art single substrate reactor 54 that overcomes some of the problems associated with the reactors of FIGS. 1 and 2. This is described in detail in U.S. Pat. No. 5,607,724. A substrate 56 is placed on a rotating pedestal 58 in chamber 54. Upper lamps 62 and lower lamps 63 radiate energy through transparent chamber walls 64 and 66 to uniformly heat the substrate 56. The pedestal 58 is turned to rotate the substrate 56, which is heated on both sides by the lamps. The substrate temperature is therefore uniform over its surface, which results in a uniform poly crystalline silicon deposition on the substrate 56. The reactor 54 does not have an injector in the chamber, which eliminates the problem of deposition on the injector 50 shown in FIG. 2. The reactant gas 67 is supplied through an inlet port 68 and exits exhaust port 70. The major problem associated with the reactor of FIG. 3 is the limited throughput, i.e. the number of substrates processed per hour. This problem can be addressed by increasing the operating pressure to 10 Torr or greater resulting in high deposition rates exceeding 1000 angstroms per minute, however operating the reactor at such high pressures can result in a gas phase reaction where silicon particles are formed in the gas and deposited on the substrate. Another problem associated with the reactor is the tendency for silicon deposition on the quartz walls 64, 66 resulting in loss of radiant energy transmission from the lamps 62, 63. This causes non-uniform heating of the substrate resulting in non-uniform film deposition on the substrate 56. Additionally, the silicon deposited on quartz wall 64 can flake off and fall onto the substrate surface 56.

Current demands of semiconductor processing require rapid film deposition with uniform and repeatable film thickness, and the smoothest film surface possible with controlled grain size. In addition, the time the substrate is above 600° C. must be held to a minimum, as heating the substrate to elevated temperatures, i.e. greater than 600° C. results in unwanted diffusion of dopants. Because of this, a high deposition rate is important to reduce the time that the substrate is above 600° C. Good film uniformity and repeatability is necessary to ensure consistent electrical performance, and smooth films are required for sub-micron lithography processes.

SUMMARY

It is therefore an object of the present invention to provide a method and apparatus for the Chemical Vapor Deposition (CVD) of various materials at a high rate.

It is a further object of the present invention to provide a method and apparatus for the CVD of various materials at a high deposition rate with improved uniformity.

It is another object of the present invention to provide a method and apparatus for the CVD of various materials at a high rate, with improved uniformity and reduced surface roughness.

Briefly, a preferred embodiment of the present invention includes a method wherein a substrate is placed in a reaction chamber and rotated to ensure uniform heating and a uniform flow of reactant gases over the substrate surface. Upper lamps positioned above the substrate and lower lamps below the substrate are activated to apply heat to an upper thermal plate and a lower thermal plate which in turn heat the wafer upper and lower surfaces. The upper and lower lamps are operated to raise the substrate temperature to 500–700° C. for silicon deposition, or any other temperature required for the deposition of other materials, and to provide a heat gradient between the upper and lower thermal plates and thus cause a thermal gradient between the upper substrate deposition surface and the upper thermal plate. This heat gradient causes a large increase in the deposition rate for a given reactant gas flow rate and chamber pressure. The preferred parameters for implementation of the present invention include the temperature of the upper thermal plate adjusted to be 100–200° C. above the temperature of the lower thermal plate, the substrate temperature in the range of 400–700° C., the reactant gas pressure between 250 and 1000 mTorr, and the gas flow rate in the range of 200–800 sccm. The substrate rotation is approximately 5 RPM, however the speed of rotation is not critical. For example, a deposition rate of about 2000 angstroms per minute is achieved with a 100–200° C. temperature differential between the thermal plates, substrate temperature about 650° C., pressure of 250 mTorr and silane flow of 500 sccm.

An advantage of the present invention is that it provides a higher deposition rate CVD method with good film quality.

A further advantage of the present invention is that it provides a CVD deposition method with a deposition rate five times more rapid than prior art methods providing comparable film quality.

IN THE DRAWING

DETAILED DESCRIPTION OF THE PREFERRED EMBODIMENT

Figure 1:
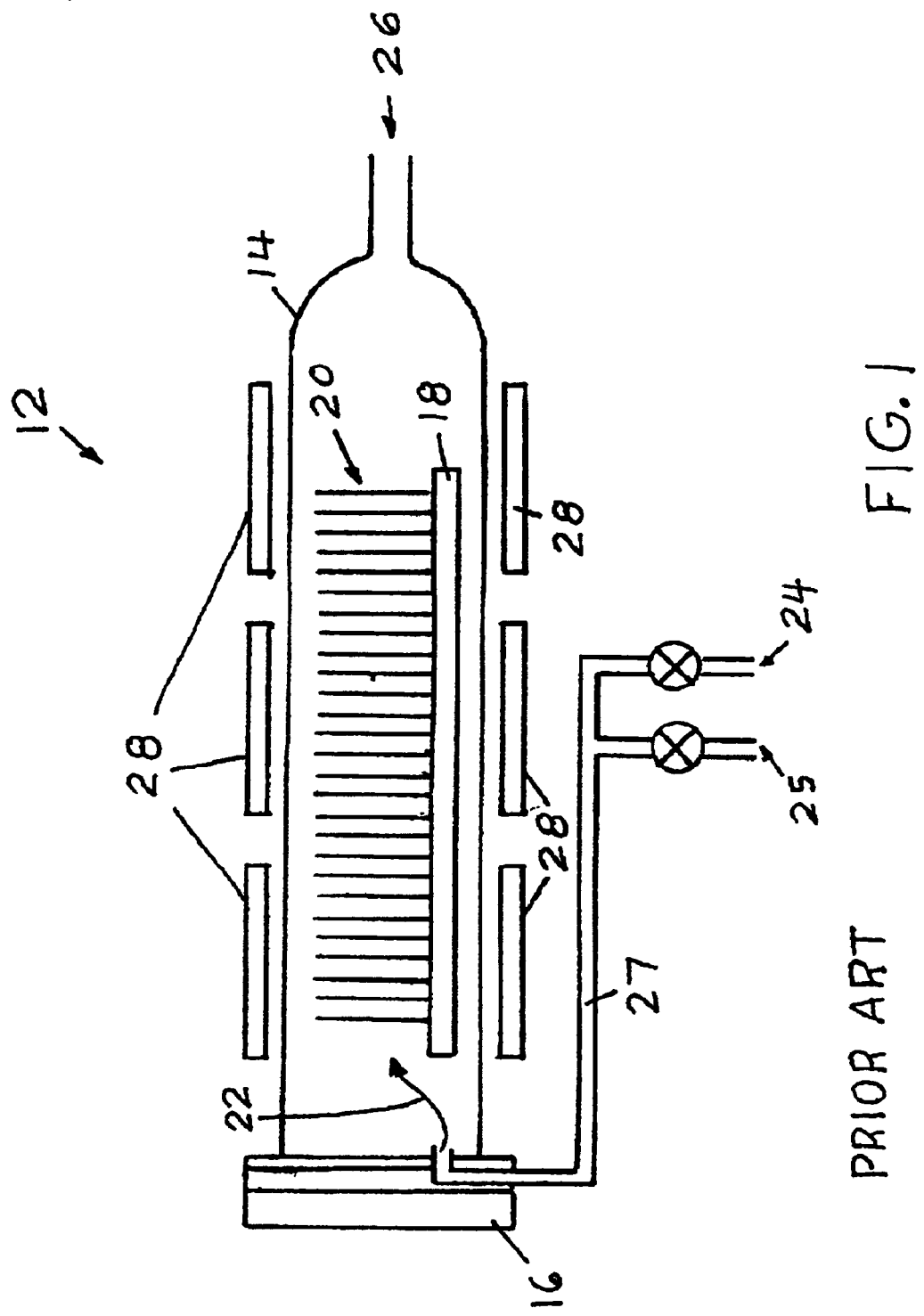
FIG. 1 illustrates a prior art multi-substrate horizontal tube reactor.
Figure 2:
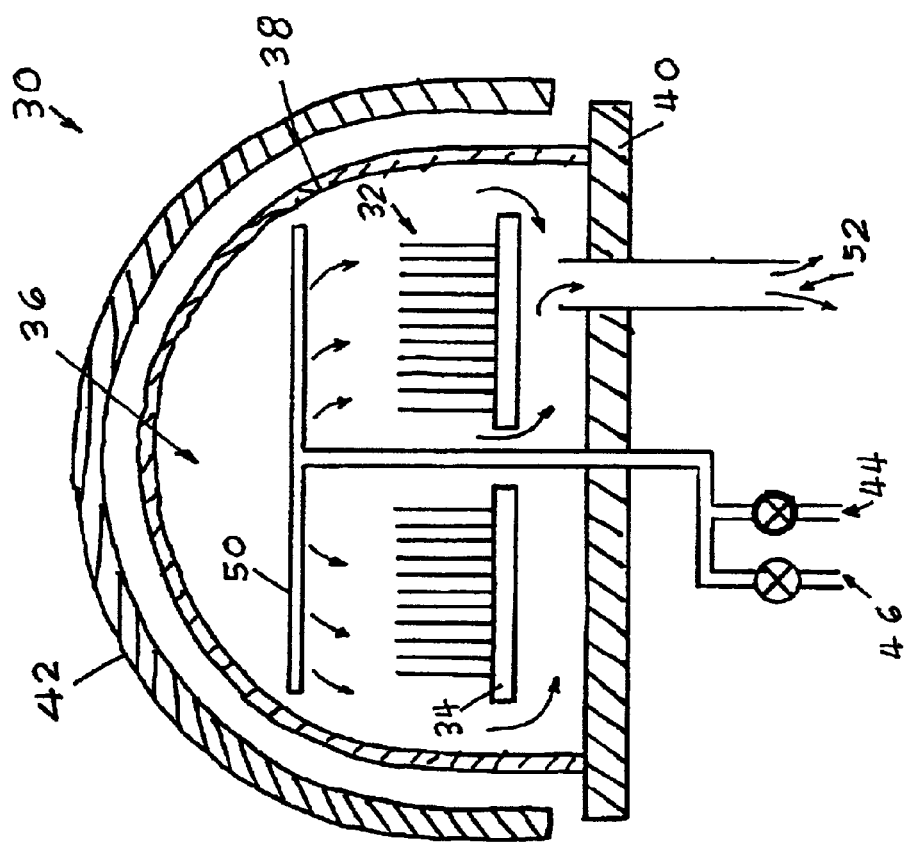
FIG. 2 illustrates a prior art multi-substrate vertical flow reactor.
Figure 3:
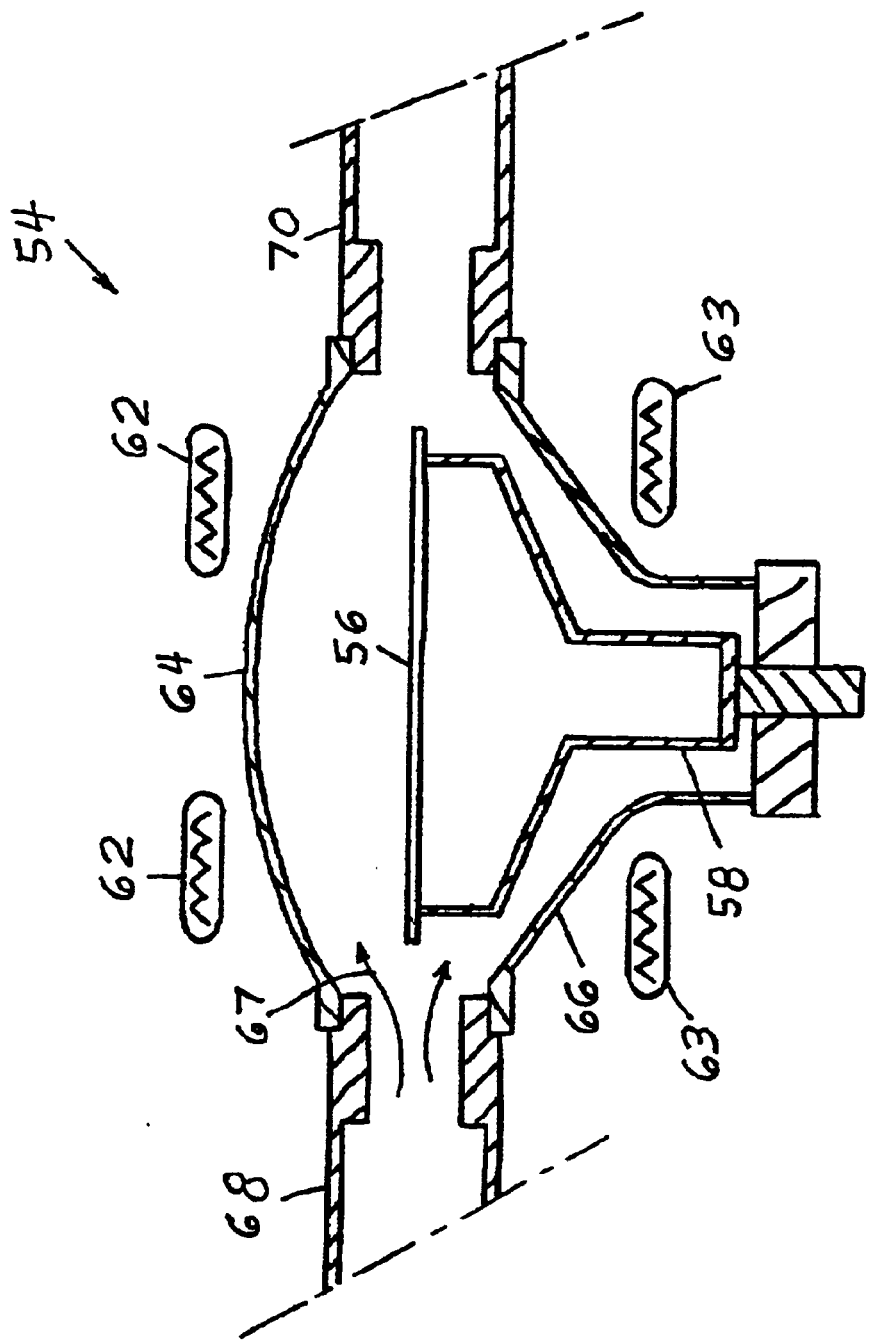
FIG. 3 shows an improved single substrate reactor with a rotatable pedestal.
Figure 4:
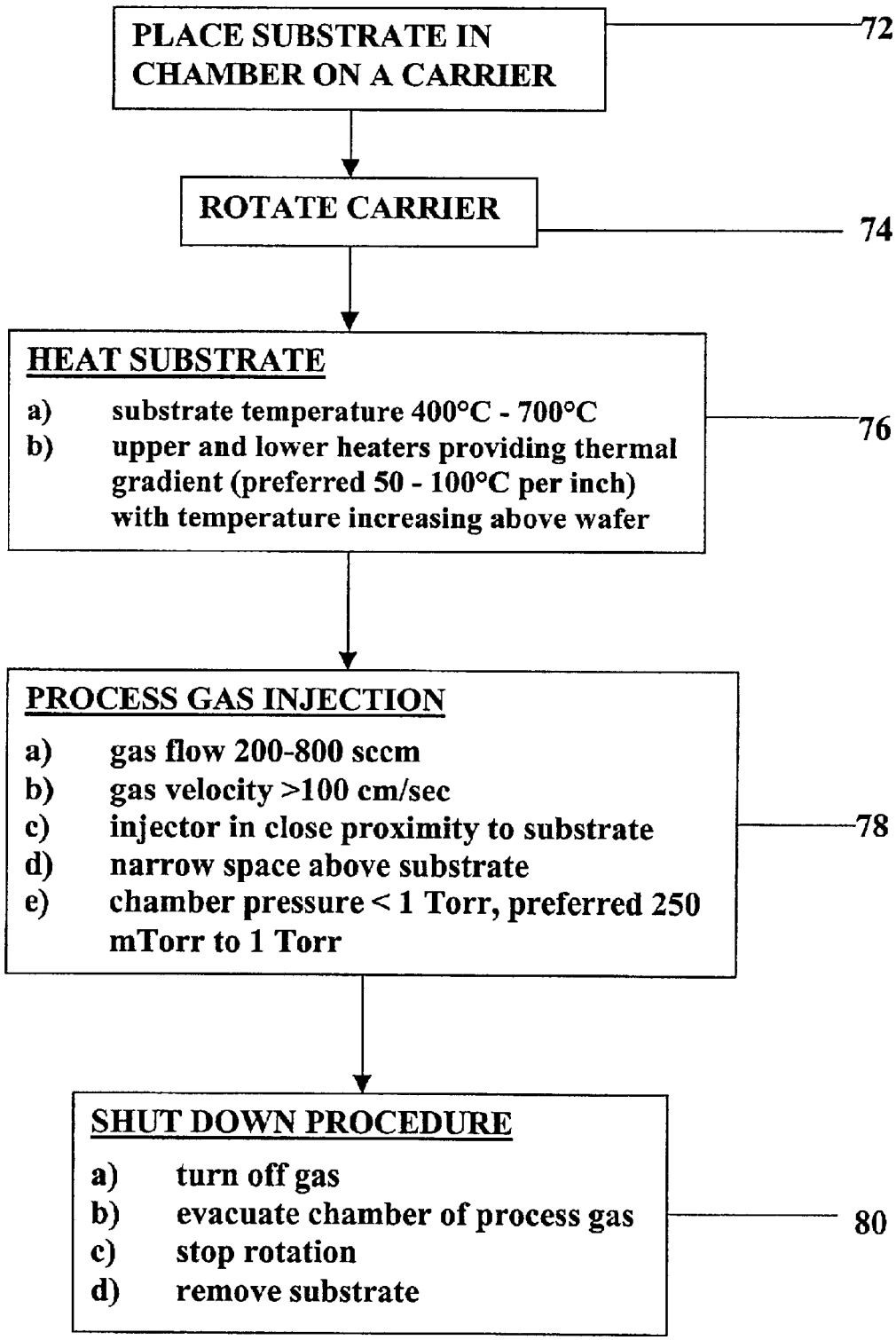
FIG. 4 is a flow chart of the method of the present invention.

Referring now to FIG. 4 of the drawing, a preferred embodiment of the method of the present invention is displayed in a flow chart. A substrate is placed 72 on a carrier in a reactor chamber, and the carrier and therefore substrate are rotated 74. The substrate is heated 76 to a temperature to cause CVD, preferably between 500° C. and 700° C., the heat being supplied by an upper heater, heating an upper thermal plate positioned above the substrate top surface and a lower heater, heating a lower thermal plate below the substrate bottom surface. The temperatures of the upper and lower heaters are displaced to provide a thermal gradient between the thermal plates, with the upper thermal plate preferably set approximately 100–200° C. above the temperature of the lower thermal plate. The thermal gradient is not critical, but preferably in the range of 50–100° C. per inch. An apparatus for achieving this will be described in reference to FIG. 5, and includes thermal plates spaced above and below the substrate, with the plates each spaced about one inch from the substrate. According to the method, the plates are heated unequally so as to cause the temperature of the upper thermal plate to be 100–200° C. above the temperature of the lower thermal plate. Other methods for creating the thermal gradient will be apparent to those skilled in the art, and these are also included in the spirit of the present invention.

The process gas is then injected 78, preferably achieving a chamber pressure in the range of 250 to 1000 mTorr. The gas is preferably injected at a rate of 200–800 sccm and at a velocity greater than 100 cm/sec across the substrate surface, with the gas stream restricted to a narrow region (0.5–1.5 inches) above the substrate. The process gas injection and temperature conditions are then maintained for the length of time required to deposit the desired film thickness, at which point a shutdown procedure 80 is implemented wherein the process gas is turned off and evacuated from the chamber, and the rotation is stopped and the substrate removed from the chamber.

The sequence of operations shown in FIG. 4 has some flexibility which will be apparent to those skilled in the art. For example, the substrate can be heated to operating temperature prior to beginning rotation, although this is not preferred. Similar variations are apparent in the shutdown procedure. These and other variations that will be apparent to those skilled in the art are included in the spirit of the present invention. The key element of novelty is the inclusion of the thermal gradient above the substrate, preferably implemented with heated thermal plates including one above and one below the substrate. The thermal plates can be heated directly with embedded resistance heaters, or heated from lamps as will be described in reference to FIG. 5. The addition of a high velocity gas stream passing across the substrate provides a source of gas with a high concentration of the desired reactant species in contact with the surface of the substrate, resulting in the deposition rate being surface reaction rate limited. The high velocity gas injection is discussed in U.S. patent application Ser. No. 09/396,588 filed Sep. 15, 1999, the content of which is incorporated herein by reference.

The very high rate of deposition enabled by the present invention at relatively low overall chamber pressures can move the reaction into the regime where the deposition rate approaches or exceeds the crystallization rate, resulting in the growth of very small crystals and therefore very smooth poly crystalline silicon films with a minimum surface roughness. The method can also be used to accelerate the deposition of intrinsically slow processes such as α-Si.

The other advantage over conventional batch CVD systems is the reduced thermal budget. As semiconductor device geometries are reduced to submicron sizes, the thermal budget must be reduced accordingly. A hot wall CVD system requires the substrates to be at elevated temperatures typically for two or more hours, while the present invention requires the substrate to be at elevated temperatures typically for two to three minutes depending on the required film thickness.

Figure 5:
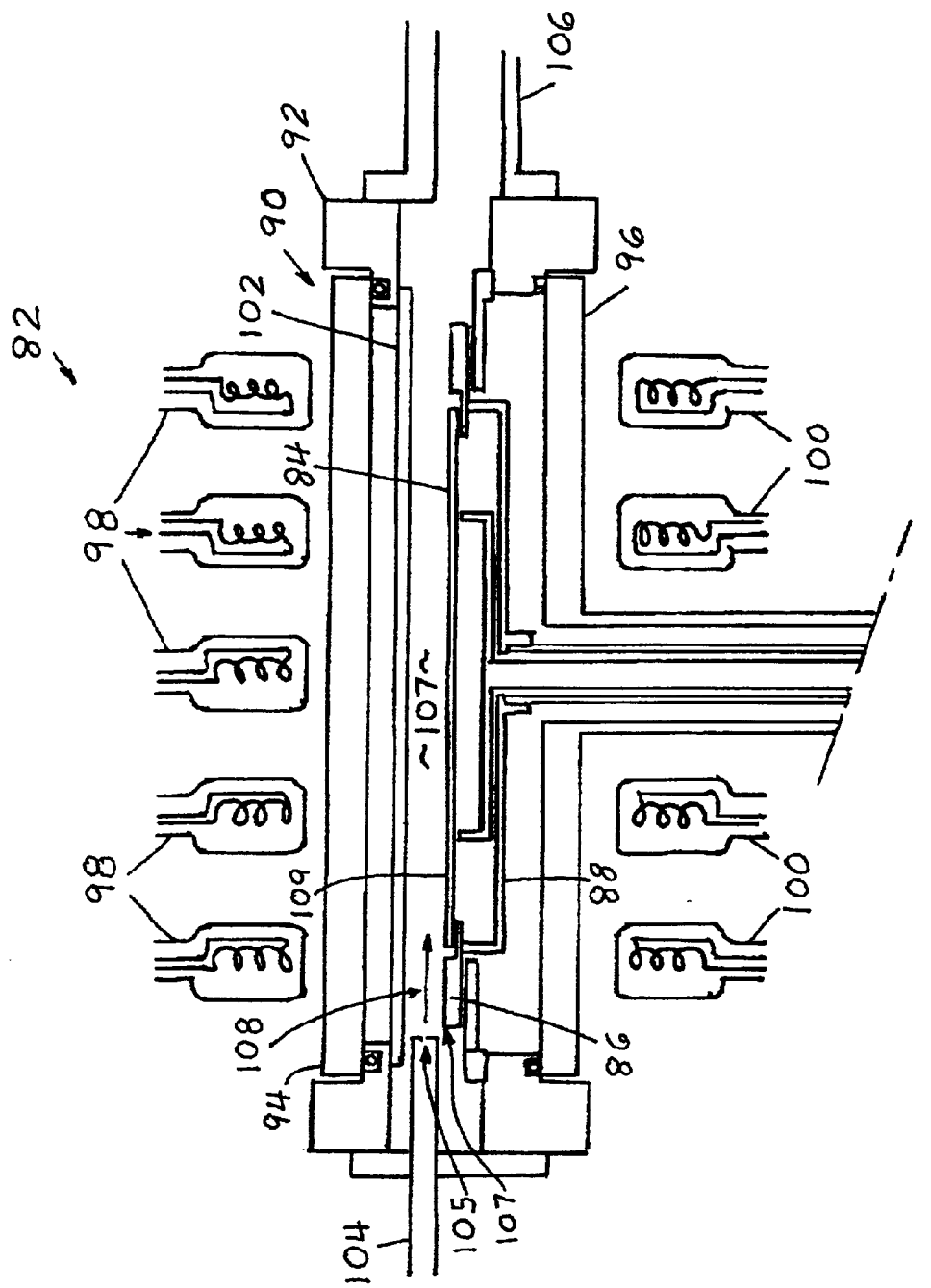
FIG. 5 is a cross-sectional view of a single substrate reactor for use in illustrating the method of the present invention.

Referring now to FIG. 5, a reactor 82 is shown that can be adjusted to perform deposition according to the present invention. A detailed description of this reactor is given in U.S. Pat. No. 5,551,985. In reference to the reactor 82 of FIG. 5, the method of the present invention begins by placing a substrate 84 on a carrier ring 86 that is supported by a rotatable heat plate 88. The vacuum chamber 90 includes an outer wall 92 with an upper quartz window 94 attached, through which heat is radiated from upper lamps 98 to heat the upper thermal plate 102 which radiates heat to the top surface of the substrate 84. Lower lamps 100 radiate heat through a lower quartz window 96 to the lower thermal plate 88 which radiates heat to the lower surface of the substrate 84. The upper lamps 98 control the temperature of the upper heat plate 102, and the lower lamps 100 control the temperature of the rotatable heat plate 88. In operation, the upper heat plate 102 is heated to a temperature approximately 100° C. above the temperature of the lower heat plate 88. Other temperature differences than 100–200° C. are included in the spirit of the present invention, as well as operational and construction alternatives such as having an upper heater and no lower heater depending on the required temperature of deposition. The purpose for the temperature difference in the plates is to provide a temperature gradient above the substrate deposition surface, with the temperature increasing with the distance above the substrate deposition surface. A preferred temperature gradient is in the range of 50 to 100° C. per inch, with the temperature increasing with distance from the deposition surface, which is the upper surface in the apparatus as described in reference to FIG. 5. As mentioned above, a gradient could be achieved with only an upper heater. The actual heater temperatures or thermal plate temperatures to achieve the required gradient will vary depending on the particular chamber dimensions (such as thermal plate position, etc.) used to implement the present invention.

In the reactor of FIG. 5, the substrate 84 reaches an equilibrium temperature approximately half way between the temperature of the upper heat plate 102 and the lower heat plate 88. The exact temperature of the substrate is very difficult to measure and is not relevant to the practice of the present invention. The reactant gases are introduced to the chamber interior by way of gas injector 104 and flow across the top surface of the substrate 84. The injector 104 may have a plurality of injector ports (not shown). The gases are preferably confined to a narrow space 107 between the substrate 84 and upper heat plate 102. The injector is also preferably oriented to direct the reactant gas 108 to impact on the deposition surface 109 of substrate 84, which maximizes the gas concentration at the substrate surface 109 and contributes to a rapid silicon deposition. In order to reduce unwanted deposition on the injector 104, the injector is typically cooled. The details of the above apparatus, including a plurality of injector ports that can be directed, as well as details for a water cooled injector are described in U.S. Pat. No. 5,551,985, the contents of which is incorporated herein by reference. The reactant gases are evacuated from the vacuum chamber through an exhaust port 106 by way of a vacuum pump (not shown). An inert gas such as argon is injected between the upper quartz window 94 and the upper heat plate 102 to prevent the reactant gases 108 from entering the space between the upper quartz window 94 and the heat plate 102. An inert gas is also injected in the space between the lower quartz window 96 and the bottom of the substrate 84 to prevent the entry of reactant gases into that space.

The deposition time for a 3000 Angstrom layer of poly crystalline silicon is typically one to two minutes, with operational conditions generally as indicated in FIG. 4. In comparison, if the substrate is heated equally from top to bottom with all other process conditions held constant, the deposition rate is reduced by a factor of 3 to 10 times or more.

Figure 6:
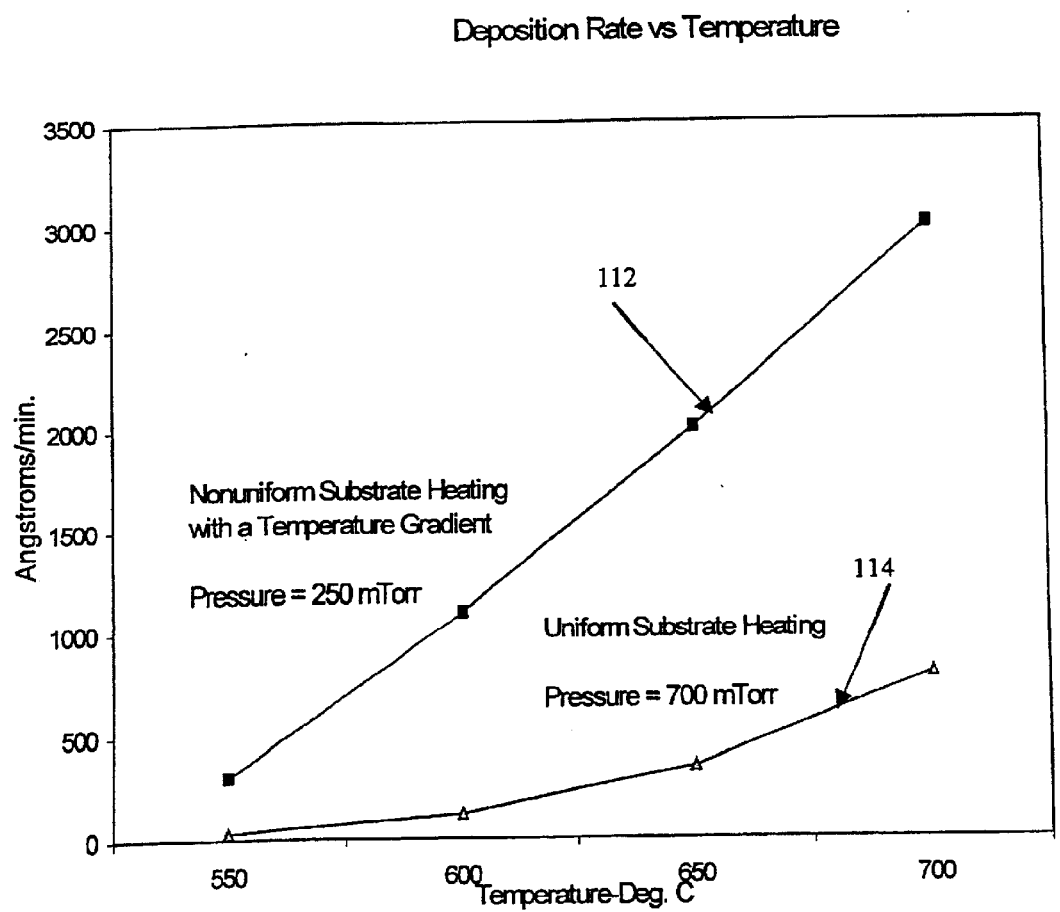
FIG. 6 is a graph of silicon deposition as a function of substrate temperature with and without application of a temperature gradient.
Figure 7:
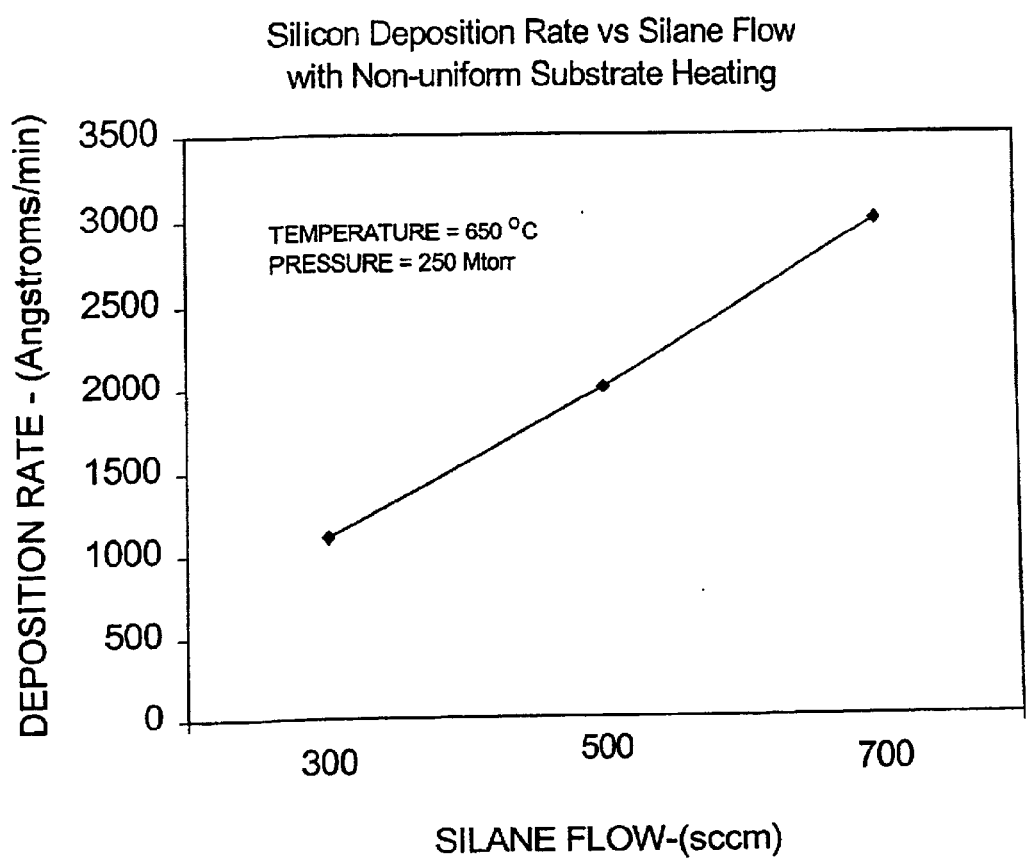
FIG. 7 is a graph of silicon deposition as a function of silane flow.

Performance characteristics of the method of the present invention using the reactor of FIG. 5 are illustrated in graphical form in FIGS. 6 and 7. FIG. 6 has two curves for comparing the deposition rate using the thermal gradient according to the present invention with the deposition rate achieved using prior art uniform heating. Curve 112 shows, for example, that at 650° C. the use of gradient heating results in a deposition rate of approximately 2000 angstroms per minute at 250 mTorr as compared with 400 angstroms per minute at 700 mTorr with uniform heating according to curve 114. The deposition rate enhancement observed due to gradient heating is in part due to the wafer temperature being higher compared to the case when it is heated equally from top and bottom, but the majority of the deposition rate enhancement is due to the thermal gradient established above the wafer. The difference between gradient heating and uniform heating shown in FIG. 6 would even be greater if the deposition shown in curve 114 had been done 250 mTorr instead of 700 mTorr. FIG. 7 shows the deposition rate as a function of silane flow, demonstrating the importance of a high flow rate for rapid deposition.

Figure 8:
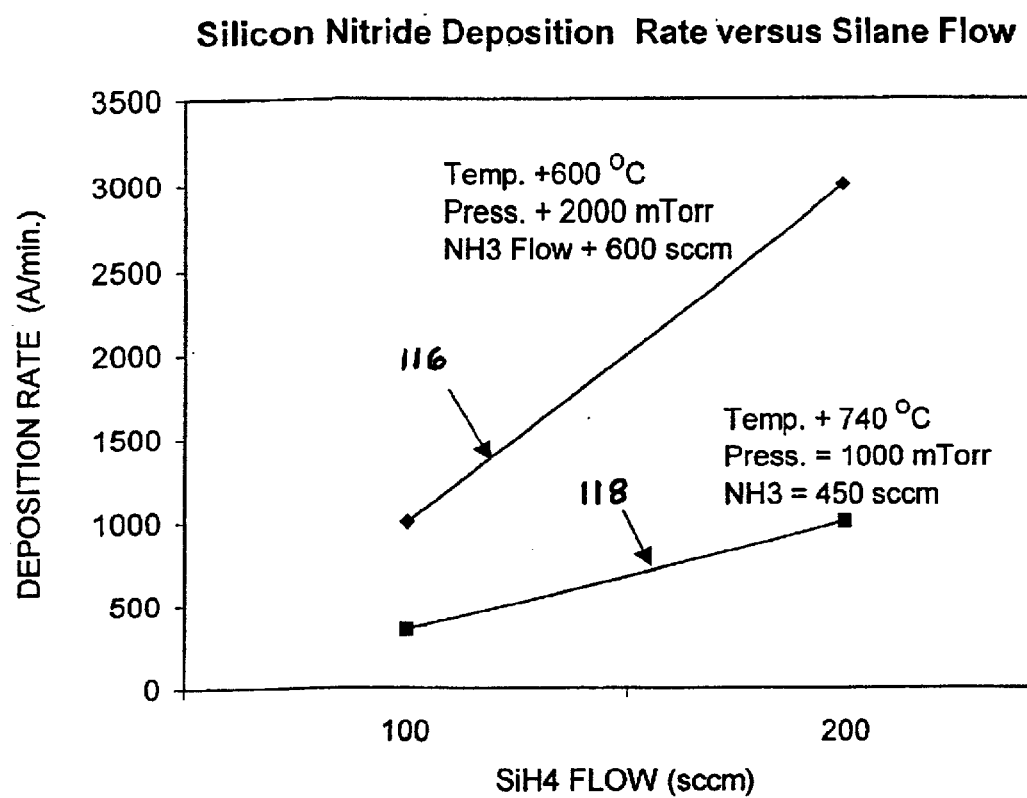
FIG. 8 is a graph of silicon nitride deposition as a function of silane flow.
Figure 9:
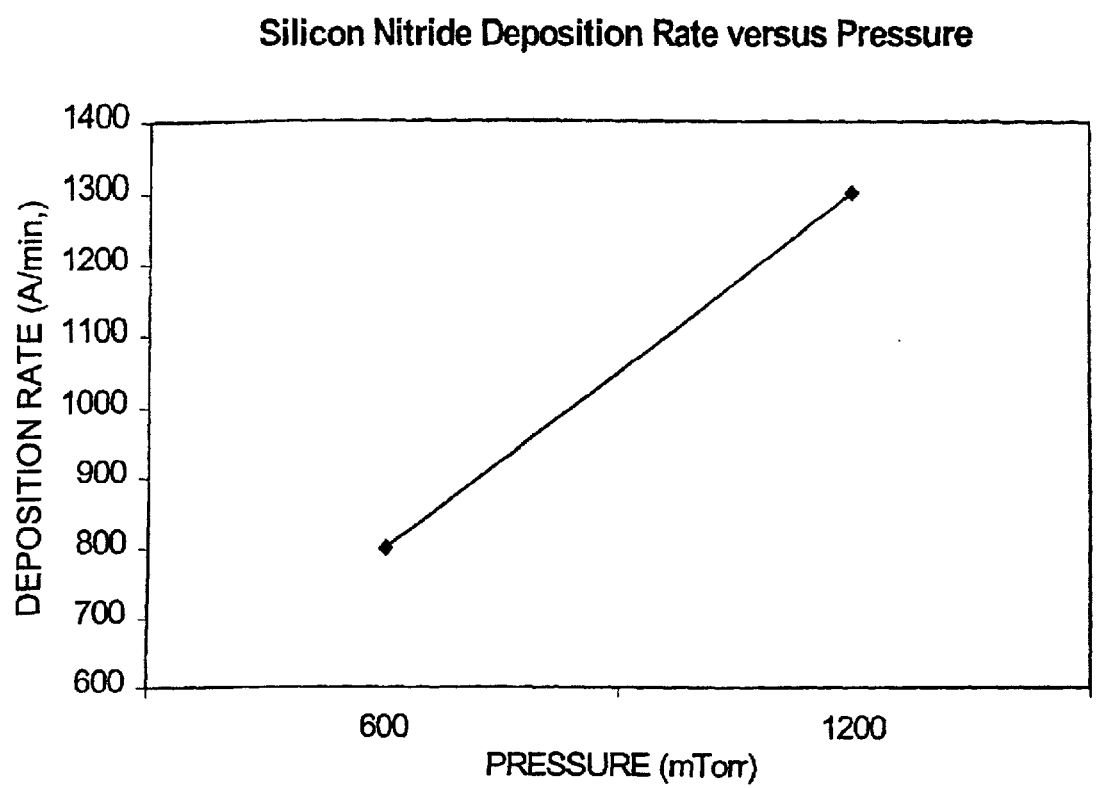
FIG. 9 is a graph of silicon nitride deposition as a function of pressure.

FIG. 8 shows the deposition of silicon nitride obtained with thermal gradient heating in the apparatus depicted in FIG. 5. Curve 116 is the deposition rate at 2000 mTorr versus curve 118 at 1000 mTorr. FIG. 9 shows the deposition rate for silicon nitride verses pressure with the method of the present invention.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of chemical vapor deposition on a substrate comprising:
   a) placing a substrate on a carrier in a deposition chamber;
   b) rotating said substrate;
   c) heating said substrate, said heating applied to create a temperature gradient in the range of 50° C. to 100° C. per inch above a deposition surface of said substrate wherein the temperature increases with increasing distance from said deposition surface; and
   d) providing a flow of process gas across a surface of said substrate by injecting said process gas at said surface with a plurality of gas injectors so as to concentrate said gas at said surface, thereby enhancing the deposition rate on said substrate over the deposition rate in an isothermal environment.

2. A method as recited in claim 1 wherein said heating is accomplished with a first heater radiating toward said deposition surface, and with a second heater radiating toward a back surface of said substrate.

3. A method as recited in claim 2 wherein said first heater radiates a different amount of heat energy than said second heater.

4. A method as recited in claim 3 wherein said heating includes a first thermal plate between said first heater and said substrate, and a second thermal plate between said second heater and said substrate.

5. A method as recited in claim 4 wherein said temperature gradient includes a temperature difference in the range of 100° C. to 200° C. between said first plate and said second plate.

6. A method as recited in claim 1 wherein said providing includes supplying said process gas at a flow rate in the range of 200 sccm to 800 sccm.

7. A method as recited in claim 1 wherein said providing includes passing said process gas over said substrate at a gas velocity in excess of 100 cm/sec.

8. A method as recited in claim 1 wherein said gas injectors are temperature controlled.

9. A method as recited in claim 1 wherein said gas injectors are directed at said deposition surface.

* * * * *